United States Patent [19]
Bae

[11] Patent Number: 5,532,114
[45] Date of Patent: Jul. 2, 1996

[54] METHOD OF FORMING A PHOTORESIST PATTERN IN A SEMICONDUCTOR DEVICE

[75] Inventor: Sang M. Bae, Seoul, Rep. of Korea

[73] Assignee: Hyundai Electronics Industries Co., Ltd., Kyunghi-Do, Rep. of Korea

[21] Appl. No.: 383,006

[22] Filed: Feb. 3, 1995

[30] Foreign Application Priority Data

Feb. 7, 1994 [KR] Rep. of Korea ................ 94-2240

[51] Int. Cl.⁶ ........................................ G03C 5/00
[52] U.S. Cl. .................. 430/312; 430/311; 430/319; 430/322; 430/394
[58] Field of Search ................ 430/311, 312, 430/319, 322, 5, 22, 394

[56] References Cited

U.S. PATENT DOCUMENTS

| | | | |
|---|---|---|---|
| 5,045,417 | 9/1991 | Okamoto | 430/5 |
| 5,217,830 | 6/1993 | Lowrey | 430/5 |
| 5,308,741 | 5/1994 | Kemp | 430/312 |
| 5,407,785 | 4/1995 | Leroux | 430/312 |

*Primary Examiner*—S. Rosasco
*Attorney, Agent, or Firm*—Fish & Richardson

[57] ABSTRACT

A photoresist pattern in a semiconductor device which can form a ultra micro pattern beyond the limitation of the resolution power obtainable by an ordinary stepper. A first, second, third and fourth exposure processes using a first, second, third and fourth photo masks.

4 Claims, 2 Drawing Sheets

METHOD OF FORMING A PHOTORESIST PATTERN IN A SEMICONDUCTOR DEVICE

BACKGROUND OF THE INVENTION

1. Field of the Invention

The present invention relates to a method of forming a photoresist pattern in a semiconductor device by multi exposure process using a plurality of photo masks, which makes a micro pattern required to an high integrated semiconductor device.

2. Information Disclosure Statement

In general, a micro pattern less than 0.25 μm wide is required for an high integrated semiconductor device. The width of a pattern is determined by the wavelength of light. Therefore, a pattern less than 0.25 μm wide can be formed by a stepper utilizing the Excimer Laser which generates a short wave length($\lambda$=248 nm).

However, when an ordinary stepper utilizing a G-line or I-line a relatively long wave length ($\lambda$=436 nm or 365 nm) is used to form a micro pattern with a width of below minimum feature size (MFS), it is difficult to form a pattern of the profile and width required for an high integrated semiconductor device because of the lower contrast of the light.

SUMMARY OF THE INVENTION

It is an object of the present invention to solve the problem with the use of the ordinary stepper in forming a photoresist pattern.

It is another object of the present invention to provide a method of forming a photoresist pattern narrower than the minimum width of a pattern formed by the ordinary stepper.

To accomplish the above objects, a method of forming a photoresist pattern in a semiconductor device according to the present invention, comprises:

providing a first photo mask having a plurality of chromium patterns and phase shift patterns formed on a quartz substrate and a plurality of shift patterns formed between the chromium patterns one by one, with widths of the chromium patterns, widths of the phase shift patterns and the distance between adjacent chromium patterns as well as between one of the phase shift patterns and one of the chromium patterns being essentially identical;

providing a wafer on which a photoresist is coated;

loading the first photo mask and the wafer into a stepper;

performing a first exposure process by the light of the stepper, whereby first light heavily exposed portions, which are heavily exposed by opened portions of the quartz substrate of the first photo mask, and first light lightly exposed portions, which are lightly exposed by the phase shift patterns of the first photo mask, are formed on the photoresist;

unloading the first photo mask from the stepper;

providing a second photo mask identical to the first photo mask, except that the arrangement of chromium patterns and phase shift patterns on a quartz substrate are in reverse to those of the first photo mask;

loading the second photo mask into the stepper;

performing a second exposure process by the light of the stepper, whereby second light heavily exposed portions, which are heavily exposed by opened portions of the quartz substrate of the second photo mask, and second light lightly exposed portions, which are lightly exposed by said phase shift patterns of the second photo mask, are formed on the photoresist;

unloading the second photo mask from the stepper;

providing a third photo mask identical to the second photo mask, except that each chromium pattern and phase shift pattern on a quartz substrate are located at position of the opened portions of the second photo mask, respectively;

loading the third photo mask into the stepper;

performing a third exposure process by the light of the stepper, whereby third light heavily exposed portions, which are heavily exposed by opened portions of the quartz substrate of the third photo mask, and third light lightly exposed portions, which are lightly exposed by phase shift patterns on the quartz substrate of the third photo mask, are formed on the photoresist;

unloading the third photo mask from the stepper;

providing a fourth photo mask identical to the third photo mask, except that the arrangement of chromium patterns and phase shift patterns on a quartz substrate are in reverse to those of the third photo mask;

loading said fourth photo mask into the stepper;

performing a fourth exposure process by the light of the stepper, whereby fourth light heavily exposed portions, which are heavily exposed by opened portions of the quartz substrate of the fourth photo mask, and fourth light lightly exposed portions, which are lightly exposed by phase shift patterns on the quartz substrate of the fourth photo mask, are formed on the photoresist;

unloading the wafer from the stepper; and removing the light heavily exposed portions by a developing process, thereby forming a plurality of photoresist patterns.

BRIEF DESCRIPTION OF THE DRAWINGS

For full understanding of the nature and objects of the invention, reference should be had to the following detailed description taken in conjunction with the accompanying drawings in which.

The same reference characters refer to the same parts throughout the several views of the drawings.

DETAILED DESCRIPTION OF THE INVENTION

In this description, the case that an image which size is the same as the pattern formed on a photo mask is transmitted to the surface of a wafer will be described in order to understand a method of forming a photoresist pattern. However, the image reduced at a fixed rate of the pattern formed on the photo mask is transmitted to the wafer during an exposure process.

Figure 1A:
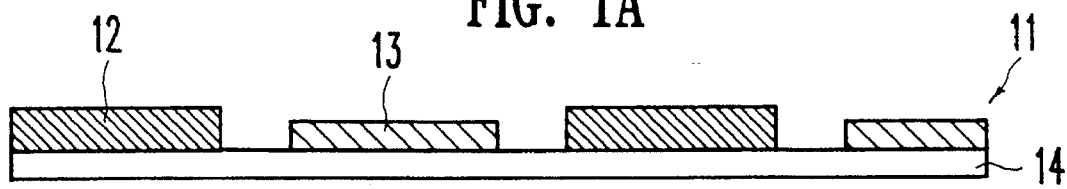
FIG. 1A through FIG. 1D are sectional views of four (f) used to form a photoresist pattern.

The first photo mask 11 of FIG. 1A comprises a plurality of chromium patterns 12 and phase shift patterns 14 formed on a quartz substrate 14. The chromium patterns 12 are formed at interval of 1 μm from each other, width of each chromium pattern 12 is 0.6 μm. Each phase shift pattern 13 is formed between the chromium patterns 12. An interval between each end of the phase shift patterns 13 and each end of the adjacent chromium patterns is 0.2 μm, a width of each phase shift pattern is 0.6 μm. The phase shift patterns 13 are formed with S.O.G.(Spin On Glass) or chromium which rate of penetration to light is 10 percent.

That is, widths of the chromium patterns 12, widths of the phase shift patterns 13 and distance between adjacent chromium patterns 12 as well as between one of the phase shift patterns 13 and one of the chromium patterns 12 are essentially identical.

Figure 1B:
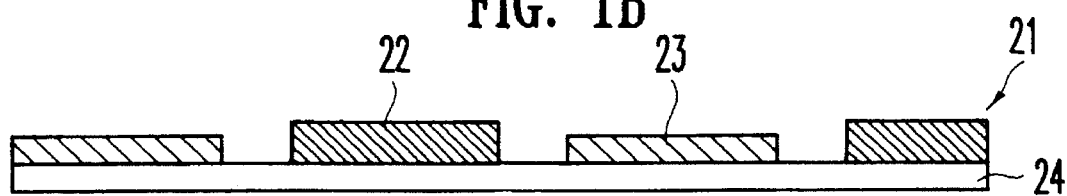

The second photo mask 21 of FIG. 1B has an identical structure with a structure of the first photo mask 11 except that the arrangement of the chromium patterns and phase shift patterns on a quartz substrate are in reverse to them of the first photo mask. That is, each phase shift pattern 23 formed on a quartz substrate 24 of the second photo mask 21 is located at position of each chromium pattern 12 of the first photo mask 11, and each chromium pattern 22 formed on the quartz substrate 24 of the second photo mask 21 is located at position of each phase shift pattern 13 of the first photo mask 11.

Figure 1C:
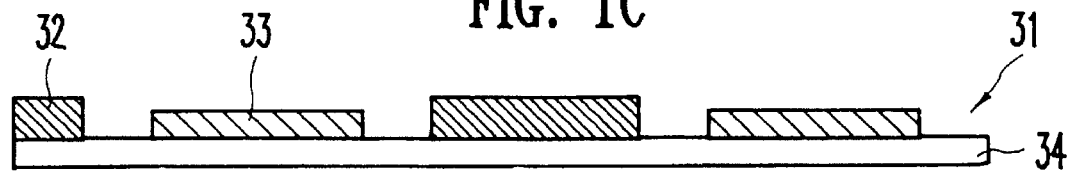

The third photo mask 31 of FIG. 1C has an identical structure with a structure of the second mask 11 except that each of the chromium pattern and phase shift pattern on a quartz substrate are located at position of opened portions of the second photo mask, respectively. That is, each phase shift pattern 33 and chromium pattern 32 formed on a quartz substrate 34 of the third photo mask 31 are located at position of each opened portion between the chromium pattern 22 and the phase shift pattern 23 of the second photo mask 21.

Figure 1D:
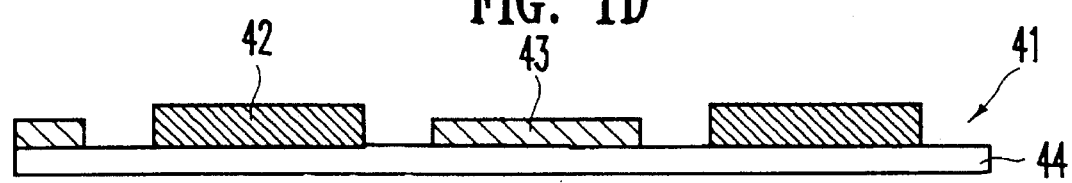

The fourth photo mask 41 of FIG. 1D has an identical structure to the structure of the third photo mask 31 except that the arrangement of chromium patterns and phase shift patterns on a quartz substrate are in reverse to them of the third photo mask. That is, each phase shift pattern 43 formed on a quartz substrate 44 of the fourth photo mask 41 is located at position of each chromium pattern 32 of the third photo mask 31, and each chromium pattern 42 formed on the quartz substrate 44 of the fourth photo mask 41 is located at position of each phase shift pattern of 33 the third photo mask 31.

Hereinafter, the method of forming a photoresist pattern according to the present invention is described in conjunction with the FIG. 2A to FIG. 2E.

Figure 2A:
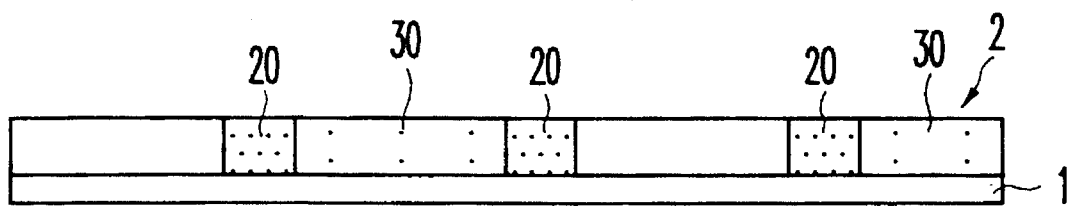
FIG. 2A through FIG. 2E are sectional views depicting each step in forming a photoresist pattern according to the present invention.

A wafer 1 on which a photoresist 2 is coated and the first photo mask of FIG. 1A are loaded into the stepper (not shown). A first exposure is performed by the light of the stepper, whereby a first heavily exposed portion 20 which are heavily exposed by opened portions of the quartz substrate of the first photo mask 11 and a first light lightly exposed portions 30 which are lightly exposed by the phase shift pattern 13 of the first photo mask are formed on the photoresist 2 as shown in FIG. 2A.

Figure 2B:
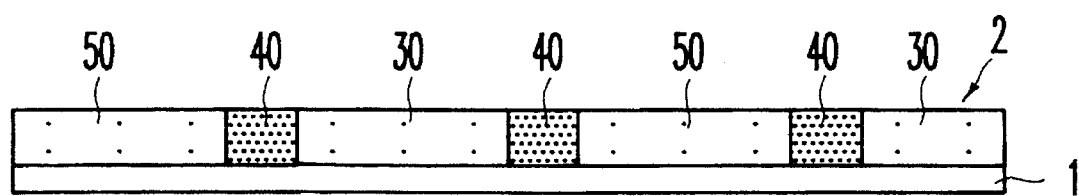

The first photo mask 11 is unloaded from the stepper and the second photo mask 21 of FIG. 1B is then loaded into the stepper. A second exposure process is performed by the light of the stepper, whereby a second light heavily exposed portion 40 which is heavily exposed by opened portions of the quartz substrate of the second photo mask 21 and a second light lightly exposed portion 50 are lightly exposed by the phase shift patterns of the second photo mask 21 are formed on the photoresist 2 as shown in FIG. 2B.

The second photo mask 21 is unloaded from the stepper and the third photo mask 31 is then loaded into the stepper.

Figure 2C:
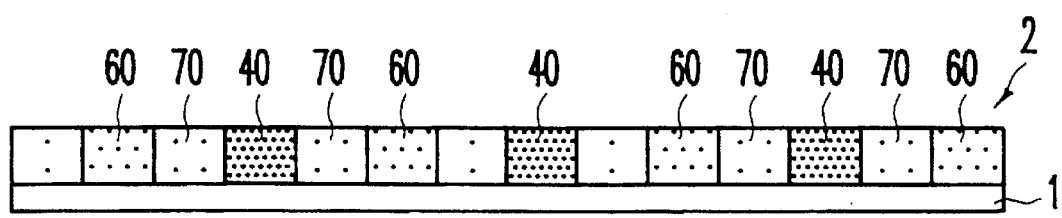

A third exposure is performed by the light of the stepper, whereby a third light heavily exposed portions 60 which are heavily exposed by opened portions of the quartz substrate of the third photo mask 31 and a third light lightly exposed portions 70 which are light exposed by the phase shift patterns of the quartz substrate of the third photo mask 31 are formed on the photoresist 2 as shown in FIG. 2C.

Figure 2D:
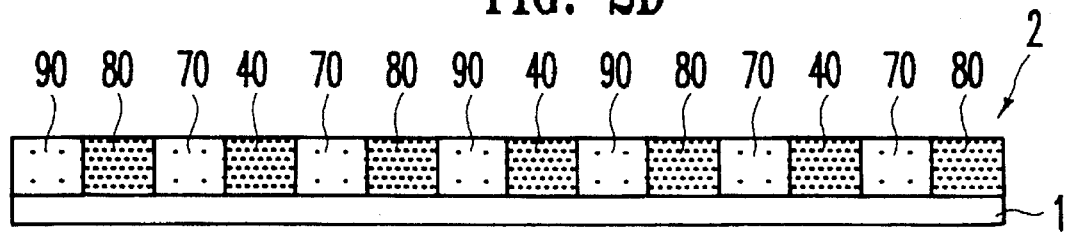

The third photo mask 31 is unloaded from the stepper and the fourth photo mask 41 is then loaded into the stepper. A fourth exposure process is performed by the light of the stepper, whereby a fourth heavily exposed portion 80 which is heavily exposed by opened portions of the quartz substrate of the fourth photo mask 41 and a fourth light lightly exposed portion 90 which is exposed by the phase shift patterns of the quartz substrate of the fourth photo mask 41 is formed on the photoresist 2 as shown in FIG. 2D.

Figure 2E:
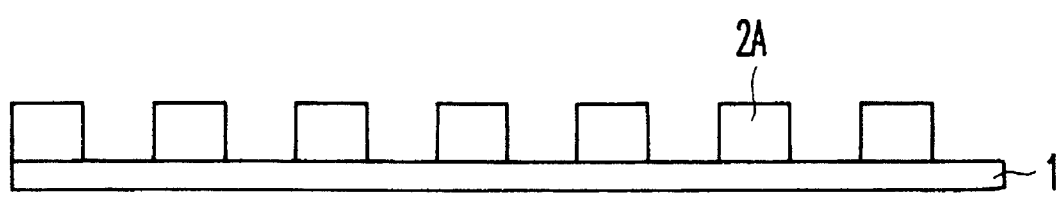

The wafer 1 is then unloaded from the stepper. The light heavily exposed portions 40 and 90 formed by the first, second, third and fourth photo masks 11, 21, 31 and 41 are removed by a developing process thereby forming a plurality of photoresist patterns 2A on the wafer 1 as shown in FIG. 2E.

The width of each photoresist pattern 2A is in proportion to the interval between the chromium pattern and the phase shift pattern of the each photo mask 11, 21, 31 and 41.

Figure 3:
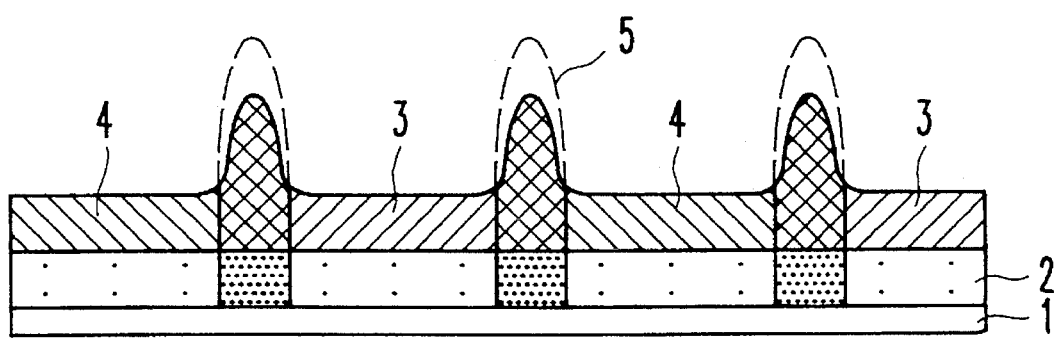
FIG. 3 is a distribution chart depicting a composite intensity of overlay exposure light energy.

FIG. 3 is a distribution chart depicting a composite intensity of exposure light energy obtained by the first and second exposure process using the first and third photo masks 11 and 31, the identical result being obtained after the third and fourth exposure processes using the third and fourth photo mask 31 and 41. The first intensity distribution curve 3 is obtained by an exposure process using the first photo mask 11, the second intensity distribution curve 4 is obtained by an exposure process using the second photo mask 21. The third intensity distribution curve 5 is obtained by a composition of the first and second distribution curves 3 and 4, the third intensity distribution curve 5 shows distribution of the high contrast and useful intensity for an overlay exposure process.

In this description, using the first, second, third and fourth photo masks 11, 21, 31 and 41 are described sequentially. However, in order to obtain the photoresist pattern 2A shown in FIG. 2E, the first, second, third and the fourth photo masks 11, 21, 31 and 41 can be used disorderly.

As described above, an intensity distribution curve having an excellent contrast can be obtained by multi exposure processes using four photo masks. Therefore, the present invention makes it possible to form a ultra micro pattern beyond the limitation of the resolution power obtainable by an ordinary stepper.

On the other hand, it is possible to obtain the photoresist patterns shown in FIG. 2E by selecting any one of the first, second, third and fourth photo masks and by adjusting the position thereof.

Although this invention has been described in its preferred form with a certain degree of particularity, those skilled in the art can readily appreciate that the present disclosure of the preferred form has been made only by way of example and that numerous changes in the details of the construction, combination and arrangement of parts may be resorted to without departing from the spirit and scope of the invention.

What is claimed is:

1. A method of forming a photoresist pattern in a semiconductor device, comprising:

providing a first photo mask having a plurality of chromium patterns and a plurality of phase shift patterns on a quartz substrate, and a plurality of shift patterns formed between said chromium patterns, with widths of each of said chromium patterns being substantially the same, widths of each of said phase shift patterns being substantially the same, a distance between adjacent chromium patterns being substantially the same and a distance between one of said phase shift patterns and one of said chromium patterns being substantially the same;

providing a wafer on which a photoresist is coated;

loading said first photo mask and said wafer into a stepper which has a capability to produce light;

performing a first exposure process using the light of said stepper to form first light heavily exposed portions which have been heavily exposed by opened portions of said quartz substrate of said first photo mask, and first light lightly exposed portions, which have been lightly exposed by said phase shift patterns of said first photo mask, on said photoresist;

unloading said first photo mask from said stepper;

providing a second mask which has identical dimensions to said first photo mask, except that an arrangement of chromium patterns and phase shift patterns on its quartz substrate are a reverse to those of said first photo mask;

loading said second photo mask into said stepper;

performing a second exposure process using the light of said stepper to form second light heavily exposed portions which have been heavily exposed by opened portions of said quartz substrate of said second photo mask, and second light lightly exposed portions, which have been lightly exposed by said phase shift patterns of said second photo mask, on said photoresist;

unloading said second photo mask from said stepper;

providing a third photo mask which has identical dimensions to said second photo mask, except that each chromium pattern and phase shift pattern on its quartz substrate are located at positions of said opened portions of said photo mask, respectively;

loading said third photo mask into said stepper;

performing a third exposure process using the light of said stepper, to form third light heavily exposed portions, which have been heavily exposed by opened portions of said quartz substrate of said third photo mask, and third light lightly exposed portions, which have been lightly exposed by phase shift patterns on said quartz substrate of said third photo mask, on said photoresist;

unloading said third photo mask from said stepper;

providing a fourth photo mask which has identical dimensions to said third photo mask, except that the arrangement of chromium patterns and phase shift patterns on a quartz substrate are a reverse to those of said third mask;

loading said fourth photo mask into said stepper;

performing a fourth exposure process using the light of said stepper to form fourth light heavily exposed portions, which have been heavily exposed by opened portions of said quartz substrate of said fourth photo mask, and fourth light lightly exposed portion, which have been lightly exposed by phase shift patterns on said quartz substrate of said fourth photo mask, are formed on said photoresist;

unloading said wafer from said stepper; and removing all of said light heavily exposed portions by a developing process, thereby forming a plurality of photoresist patterns.

2. The method of claim 1 wherein each said phase shift patterns are formed with S.O.G. (Spin on Glass).

3. The method of claim 1 wherein said phase shift patterns are formed with a chromium component, said chromium component having a rate of penetration to light which rate is 10 percent.

4. A method as in claim 1, wherein a width of the phase shift pattern is substantially 0.6 um.

* * * * *